United States Patent
Schultz et al.

(10) Patent No.: US 7,701,677 B2
(45) Date of Patent: Apr. 20, 2010

(54) INDUCTIVE QUENCH FOR MAGNET PROTECTION

(75) Inventors: Joel Henry Schultz, Newtonville, MA (US); Leonard Myatt, Norfolk, MA (US); Leslie Bromberg, Sharon, MA (US); Joseph V. Minervini, Still River, MA (US); Timothy Antaya, Hampton Fall, NH (US)

(73) Assignees: Massachusetts Institute of Technology, Cambridge, MA (US); Still River Systems, Inc., Littleton, MA (US)

( * ) Notice: Subject to any disclaimer, the term of this patent is extended or adjusted under 35 U.S.C. 154(b) by 775 days.

(21) Appl. No.: 11/517,490

(22) Filed: Sep. 7, 2006

(65) Prior Publication Data

US 2008/0062588 A1 Mar. 13, 2008

(51) Int. Cl.
*H02H 7/00* (2006.01)
*H02H 9/00* (2006.01)
*H05B 6/02* (2006.01)
*H05B 6/10* (2006.01)
*H05B 6/04* (2006.01)
*H01F 7/00* (2006.01)

(52) U.S. Cl. .................. 361/19; 361/141; 219/600; 219/635; 219/660; 335/216

(58) Field of Classification Search .............. None
See application file for complete search history.

(56) References Cited

U.S. PATENT DOCUMENTS

| | | | |
|---|---|---|---|
| 4,764,837 A * | 8/1988 | Jones ..................... 361/19 |
| 4,895,831 A | 1/1990 | Laskaris | |
| 4,987,390 A | 1/1991 | Mouri et al. | |
| 5,225,956 A * | 7/1993 | Hara et al. ............... 361/19 |
| 5,241,447 A * | 8/1993 | Barber et al. ............ 361/141 |
| 5,278,380 A * | 1/1994 | Lowry .................... 219/635 |
| 5,426,366 A * | 6/1995 | Overweg et al. .......... 324/319 |
| 5,731,939 A * | 3/1998 | Gross et al. ............... 361/19 |
| 5,892,644 A | 4/1999 | Evans et al. | |
| 6,147,844 A * | 11/2000 | Huang et al. ............... 361/19 |
| 6,201,392 B1 | 3/2001 | Anderson et al. | |
| 6,337,785 B1 | 1/2002 | Okazaki et al. | |
| 7,116,535 B2 * | 10/2006 | Huang ...................... 361/19 |
| 7,477,492 B2 * | 1/2009 | Mallett .................... 361/19 |
| 7,492,556 B2 * | 2/2009 | Atkins et al. ............. 361/19 |
| 2004/0027737 A1* | 2/2004 | Xu et al. ................... 361/19 |
| 2008/0232004 A1* | 9/2008 | Blakes ..................... 361/19 |

OTHER PUBLICATIONS

International Search Report, PCT/US07/77693, mailed Feb. 28, 2008.
Written Opinion of the International Searching Authority, PCT/US07/77693, mailed Feb. 28, 2008.

* cited by examiner

*Primary Examiner*—Stephen W Jackson
*Assistant Examiner*—Dharti H Patel
(74) *Attorney, Agent, or Firm*—Choate, Hall & Stewart, LLP

(57) ABSTRACT

A coil system for inductively heating a superconducting magnet in order to provide an internal energy dump by uniformly quenching a high performance superconducting magnet. The quench-inducing system uses AC magnetic fields that require negligible reactive power. The system is especially suited for inducing a relatively uniform quench in dry superconducting magnets.

14 Claims, 3 Drawing Sheets

INDUCTIVE QUENCH FOR MAGNET PROTECTION

BACKGROUND OF THE INVENTION

This invention relates to a quench system for protecting superconducting magnets. High performance superconducting magnets operate at high current densities with zero or near zero resistivity. The high current densities and zero or near zero resistance minimize the size of the magnet winding, allowing for more compact magnets and increased magnetic fields.

If the temperature, field, or current is too high in some region of the superconductor, it loses its superconducting properties and becomes resistive or normal. Typically superconductors in the normal state are much more resistive than copper. The current flows in the high conductivity metal (usually copper or aluminum) that usually shunts the superconductor. The region of the winding where electrical current flows in the normal conducting material region due to the superconducting material losing its superconducting ability is called the quench zone or the normal zone. In the normal zone the winding is resistive and heat is generated by the current passing through it. In many instances this heating can result in local conductor damage. Although there is a normal conducting matrix (such as copper or aluminum) shunting the superconductor in superconducting windings, high performance magnets can generate large amounts of heating in this normal conducting material if the quenched zone is too localized. In order to prevent destruction of the magnet due to the strong local heating in the winding, it is necessary to quickly remove the stored magnetic energy from the magnet by dumping the stored magnetic energy in an external resistor or in an external electrical energy storage unit, or by depositing the energy relatively uniformly over the volume of the magnet to minimize the peak temperature of the initial normal zone.

High performance magnets are characterized by higher currents, current densities, as well as higher peak fields, forces and stored energy than other superconducting magnets. For high performance magnets it is difficult to remove the energy from the magnet fast enough, due to the high voltages that would be required. The high voltage is a result of the need to quickly discharge the magnet. It is more desirable to dissipate the magnetic energy in a substantial fraction of the volume of the magnet winding itself. The heating energy per unit volume required for achieving the superconducting-to-normal transition in the conductor depends on the nature of the magnet. Systems in good direct contact with liquid He require high energy inputs, on the order of 1 $J/cm^3$. However, dry magnets that are cooled in the absence of liquid cryogens by direct thermal conduction to a cold anchor (for example, a cryocooler) require much less heating energy per unit volume, usually less than 100 $mJ/cm^3$.

Superconducting windings may have a distribution of fields over the winding, such that some areas have large stability margins and others do not. In such instances a section of the winding may go normal, while the remainder stays superconducting, and as a consequence only a small portion of the magnet is heated. There may develop in such instances large temperature differentials across the winding, resulting in damage due to the build up of large mechanical stresses from the differential thermal expansion of the heated vs unheated areas. In this instance it is necessary to make the cold stable areas of the magnet go normal quickly to avoid such stresses that can also damage the winding.

To achieve internal dissipation (dumping) of the stored magnetic energy in a substantial fraction of the magnet volume, it is necessary to actively raise the temperature of a large fraction of the conductor winding above the current sharing temperature (the temperature at which current begins to flow in the normal conducting material) in a time that is small when compared with the natural decay time of the current. The heating makes the superconductor go normal, forcing the current to shift to the normal conducting material shunting the superconductor, and resulting in substantial heat dissipation in the bulk winding and a further overall temperature increase. The process results in more uniform temperature over the winding volume, and also decreases the peak temperature of the winding after the magnet has been discharged.

The heating of the conductor winding has been accomplished in the past by the use of local Joule heaters, either actively energized (by the use of external power supplies) or internally generated (by the use of internal loops that are inductively coupled to the main fields, energized by a current decrease in the main magnet or driven by internal transformers).

In low performance magnets, heating of the surface of the coil winding pack is sufficient because of the relatively long times allowed for the quench. Thermal diffusion through the conductor layers and insulation is high enough to allow heating of a substantial fraction of the coil cross section on a time scale short relative to the coil dump time scale.

In high performance magnets, in order to minimize the possibility of short-circuiting the coils and/or the heating elements, the Joule heating elements are located on the surface of the coil winding pack, usually in locations where the heating elements are not in direct mechanical load paths. In these high performance magnets, the times allowed for the dump of the stored energy are small enough so that it is usually not possible to depend solely on thermal conductivity across conductor layers or along the conductor to provide a relatively uniform temperature of the coil winding.

It is well known that the conductor windings, when in the superconducting state, can be heated by the use of AC losses (losses due the presence of an AC magnetic field). Several AC loss mechanisms are known to occur in superconducting windings, including eddy current losses, hysteresis losses, and coupling losses. Eddy current losses are caused by magnetic field diffusion through the normally conducting material (non-superconducting fraction). Hysteresis losses are due to magnetization effects in the superconducting material, as the AC field penetrates the surface of the superconductor. Coupling losses are due to losses through the superconductor/normal conducting material interface due to flux linkage through twisted superconductors.

The problem with heating the coil using AC losses by small rippling oscillation of the main magnetic field is that the power required to change the field is very high. If $I_{DC}$ is the current generating the main field, and $I_{AC}$ is the AC current, the ratio of the energy in the AC magnetic field to that in the main magnetic field is of order $I_{AC}/I_{DC}$, and this scaling results in very high powers being required in the externally driven AC magnetic field.

It is an object of this invention to heat a substantial fraction of the conductor of a superconducting magnet through non-conductive processes without requiring large reactive power to protect the magnet from destruction.

SUMMARY OF THE INVENTION

In one aspect of the invention, the quench system for magnet protection includes a DC superconducting coil and an AC coil system located in proximity to the DC superconducting coil to generate AC magnetic fields. The AC magnetic fields heat the DC coil to cause a superconducting-to-normal transition over a substantial fraction of the DC superconducting coil. In a preferred embodiment, the DC superconducting coil and the AC coil system are arranged so that the mutual inductance between the DC superconducting coil and the AC coil is close to zero. The magnetic fields of the DC superconducting coil and AC coil system may be orthogonal to one another to provide the low mutual inductance. The only requirement is that the AC field be well coupled to the main coil to result in substantial AC losses (due to hysteresis, coupling or eddy current heating).

The AC coil system may include a plurality of coils. In one embodiment, the AC coil system is wound by interleaving loops or sets of an equal number of loops between the plurality of coils to decrease internal voltages generated in each coil. Each coil in the AC coil system may approach zero mutual inductance with respect to the DC superconducting coil. Alternatively, the overall AC coil system approaches zero mutual inductance with the DC coil, but each separate coil of the plurality of coils of the AC coil system has a finite mutual inductance with respect to the DC superconducting coil. A preferred embodiment includes a high voltage insulation between the AC coil system and the DC superconducting coil.

In yet another embodiment, the system includes an electrically conducting thermal blanket surrounding the DC superconducting coil. Thermal blankets are used in dry magnets (that lack liquid coolant) as means of effectively conducting heat from poorly cooled coil sections to the cooling circuit. The thermal blanket includes gaps to prevent induced currents in the thermal blanket from shielding AC magnetic fields generated by the AC coil system from the DC superconducting coil.

Suitable frequencies of the AC magnetic fields are in the range of 100 Hz to 10 kHz. Suitable magnitude of the AC magnetic fields is in the range of 50 to 300 G.

DETAILED DESCRIPTION OF CERTAIN PREFERRED EMBODIMENTS

The purpose of the invention is to decrease the reactive power required to drive AC magnetic fields that result in sufficient heating of a superconducting winding so that a quench is generated in a short time interval over a large fraction of the main superconducting coil.

Embodiments of the invention described below can be interpreted in terms of either magnetic fields or mutual inductances. In order to decrease the required energy in the AC magnetic field used to heat the main DC superconducting magnet, the AC magnetic fields are oriented, in some embodiments, normal to the steady state main field. By design then, the ratio of the energy in the AC magnetic field to that of the main DC magnetic field scales as $(I_{AC}/I_{SC})^2$, where $I_{AC}$ and $I_{SC}$ are the AC coils' and the main superconducting coil's currents respectively. Since the ratio $I_{AC}/I_{SC}$ is much smaller than one, the energy in this configuration is much smaller than in conventional inductive heaters, where rippling oscillations in the main field are used to establish the AC magnetic fields, and energy scales as $I_{AC}/I_{SC}$ as shown above. In terms of mutual inductances, if the mutual inductance between the AC quench-inducing coil and the DC coil is M, and $L_{AC}$ and $L_{SC}$ are the AC quench-inducing coil and main superconducting coil self inductances respectively, then the ratio of the AC magnetic field to the DC main field energies is given by:

$$(MI_{AC}I_{SC} + L_{AC}I_{AC}^2)/L_{SC}I_{SC}^2$$

This ratio is approximately $MI_{AC}/L_{SC}I_{SC}$ if M is not zero, but is $L_{AC}I_{AC}^2/L_{SC}I_{SC}^2 \sim (I_{AC}/I_{SC})^2$ if M=0. Thus if M is zero, the ratio between the reactive energy and the steady state main magnetic field energy can be made much smaller, reducing the power required to initiate the magnet quench.

The fact that the DC field from the main superconducting coil set and the AC magnetic field from the quench-inducing coil set are orthogonal has the electrical property that the mutual inductances between the two coil sets is 0. There is no net magnetic flux linkage between the two coil sets, and powering one set avoids the reactive power required if they are mutually coupled. This criterion can then be used to generate coil geometries that can be used for quenching a superconducting magnet while using little reactive power.

Figure 1:
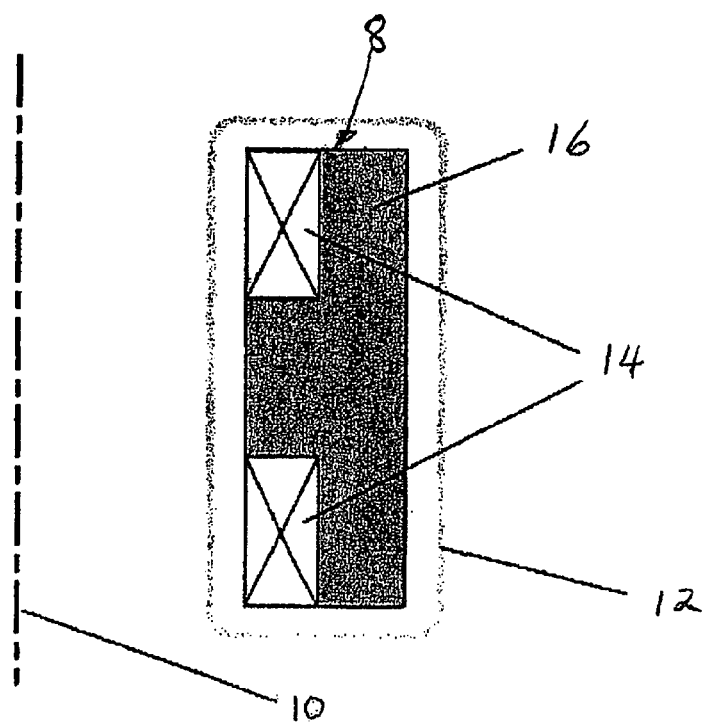
FIG. 1 is a cross-sectional view of an embodiment of the inductive quench system of the invention.

In the case of a main DC superconducting coil 8 in the shape of solenoidal windings as shown in FIG. 1, which produces field in the radial and vertical direction (for a main superconducting coil with an axis 10 aligned in the vertical direction), an AC quench-inducing coil arrangement that generates fields in the toroidal direction (in the same direction as the windings in the main superconducting coil in the shape of a solenoidal winding) meets the requirement of zero mutual inductance. Such a field can be generated by the use of a toroidal winding 12 that surrounds the superconducting solenoidal windings 14 as shown in FIG. 1. A structural support 16 reinforces DC coil 8.

An advantage of the condition of M=0 is that there are no forces acting between the AC toroidal quench inducing coil 12 and the main superconducting windings 14. The AC quench inducing coil 12 needs to be supported only due to the self-loads.

An advantage of this winding arrangement is that the AC coil 12 or coil set does not have to be in contact with the main superconducting winding or winding set 14 that produces the DC magnetic field. It is enough that they be located in the proximity of the main superconducting coil. In contrast, the Joule heaters of the prior art need to be in intimate contact with the main superconducting coil set in order to transmit the heat through thermal conduction, because radiation heat transfer is too slow. The fact that the AC quench-inducing coil set 12 does not have to be in intimate contact with the main superconducting winding set 14 minimizes the possibilities of shorts between the main superconducting winding or winding set 14 and the AC quench-inducing coil 12 or coil set, as well as the possibility of breakdown because of high voltages generated in either coil set or between the two coil sets or mechanical damage due to the quench inducing element being in the main structural load path.

The AC magnetic field of the winding 12 needs to penetrate the superconducting winding 14. In the case of the solenoidal magnet in FIG. 1, the fields penetrate throughout the main superconducting winding or winding set 14 as long as there is not an electrically conducting element that allows shielding currents to flow uninterrupted in the poloidal direction (i.e. in the same direction as the direction of the current flow in the toroidal AC quench-inducing winding 12). Such a conducting brake is indicated in 20.

It is useful to surround superconducting magnets with thermal blankets to remove or spread the heat. The use of thermal blankets is especially useful in the case of dry superconducting magnets without liquid helium coolant that accesses all surfaces around the magnet. These thermal blankets may also be good electrical conductors.

Figure 2:
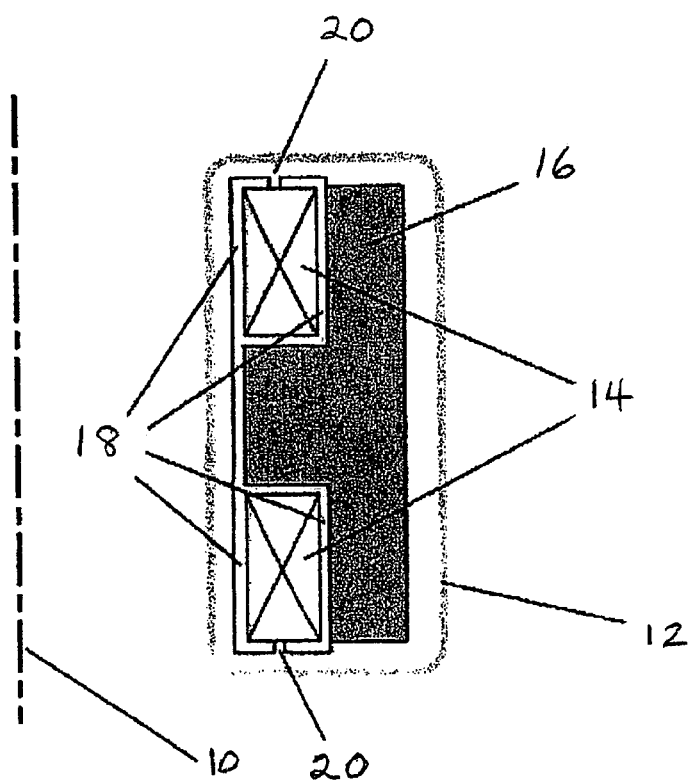
FIG. 2 is a cross-sectional view of the embodiment of FIG. 1 including thermal blankets having a gap.

With reference now to FIG. 2, we have determined by detailed analysis that in the case of a thermal blanket 18 that surrounds the main superconducting winding or winding set 14, a gap 20 that prevents poloidal currents from flowing in the thermal blanket 18, is all that is needed to allow the AC magnetic field from the quench-inducing coil set 12 to penetrate throughout the superconducting winding or winding set 14. Without the gaps 20, eddy currents flowing in the thermal blanket 18 would shield the AC magnetic flux.

The same approach can be used for other types of magnets. In the case in which the main superconducting coil set is itself a toroidal magnet, the AC quench-inducing coil set can be a winding that uniformly surrounds the toroidal field coils. Alternatively, a set of poloidal field coils which generate the fields in the vertical and radial directions would result in near zero mutual inductance.

The same topology is useful in the case of a dipole/quadrupole magnet, with an AC quench-inducing coil set surrounding each leg of the dipole/quadrupole magnet.

The description above eliminated mutual coupling between coil sets by using orthogonal (perpendicular) magnetic fields. There are several means of decreasing or eliminating the mutual inductance coupling between the AC quench-inducing coils and the main superconducting coil without imposing the requirement that the AC magnetic field should be perpendicular to the main magnetic field.

Figure 3:
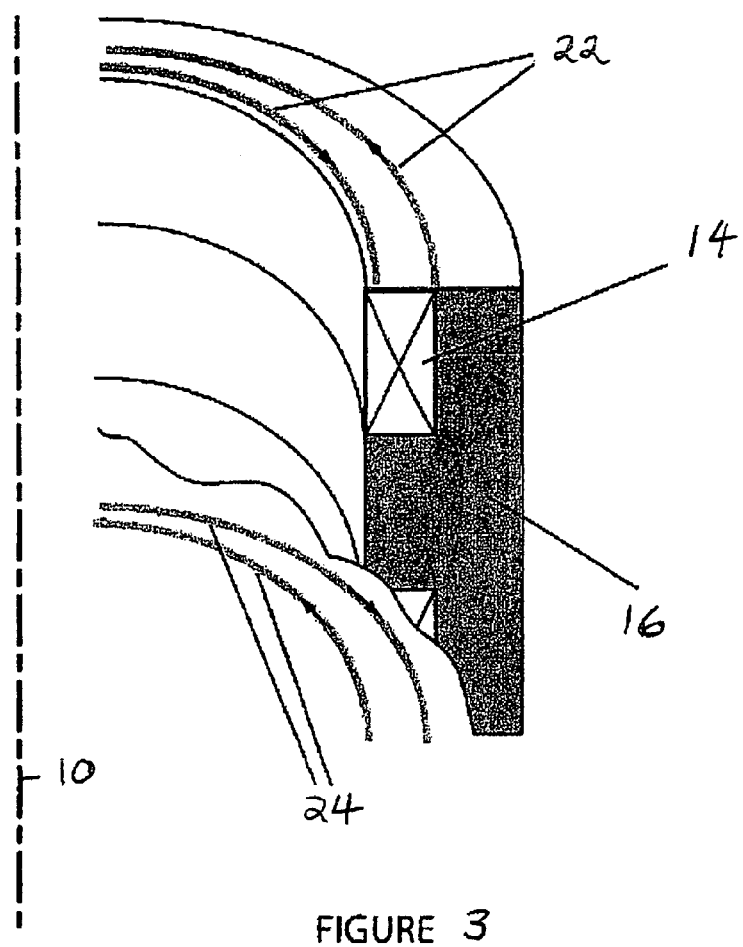
FIG. 3 is a perspective view of another embodiment of the quench system according to the invention.

FIG. 3 shows a configuration of saddle quench-inducing coils 22 and 24 where the overall mutual inductance is 0, but each unpaired saddle quench-inducing coil has non-zero inductance with respect to the main superconducting winding or winding set 14. The direction of current flow through each saddle coil 22, 24 is shown. The geometry is such that the voltage induced in the upper saddle coil 22 is equal in magnitude but opposite in polarity to the voltage induced in the lower saddle quench-inducing coil 24, so that the mutual inductance between the main superconducting winding or winding set 14 and the upper saddle quench inducing coil 22 has the opposite sign of the mutual inductance between the main super conducting winding or winding set 14 and the lower saddle coil 24. In this case, the voltage through the leads of the main superconducting winding or winding set 14 will be low, but there can be high internal voltages.

If each coil 22, 24 were to be driven separately, each coil would require large amounts of reactive power and high voltage across the terminal. But if they are driven in series, the reactive power of one coil with the opposite phase of the other coil system results in low power, since the overall mutual inductance is 0. This arrangement generates internal voltages in the AC quench inducing coils, which can be handled because the coils do not need to be in contact with the main superconducting winding or winding set 14, and thus can be properly insulated.

In the case of FIG. 3 although the net forces between the two coils are 0, there are torques generated between the coils. These torques need to be supported.

Figure 4:
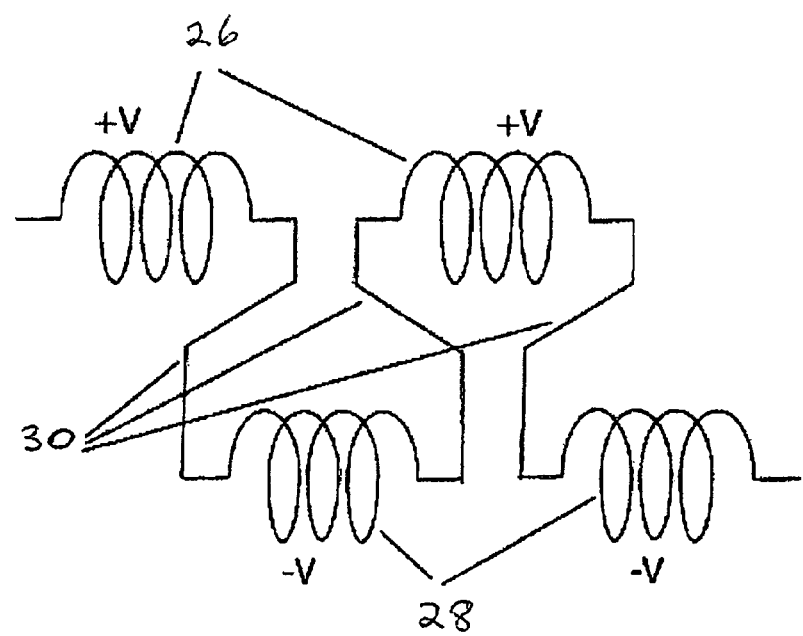
FIG. 4 is a schematic diagram illustrating a coil system wound by interleaving loops.

Internal high voltages in the AC inducing coils 22, 24 such as those shown in FIG. 3 can be minimized by alternating loops, as shown in FIG. 4. The voltage due to mutual inductance in loop or set of loops 26 in the upper saddle quench-inducing coil 22 have the opposite polarity from the mutual inductance in loop or set of loops 28 in the lower saddle quench-inducing coil 24. The loops in either upper or lower saddle coil have the same magnitude of inductance with respect to the solenoidal magnet winding 14, but are of different signs. Low voltages can be achieved by interleaving the winding, so that the winding consists of a loop or set of loops 26 in the upper saddle quench-inducing coil 22 electrically connected by one of the shunts 30 to loop or set of loops 28 in the lower saddle quench-inducing coil 24. The maximum voltage is decreased by the number of shunts between the upper and lower saddle quenching coils and the total number of turns in either coil. The minimum voltage across layers is the voltage of a single loop.

Figure 5:
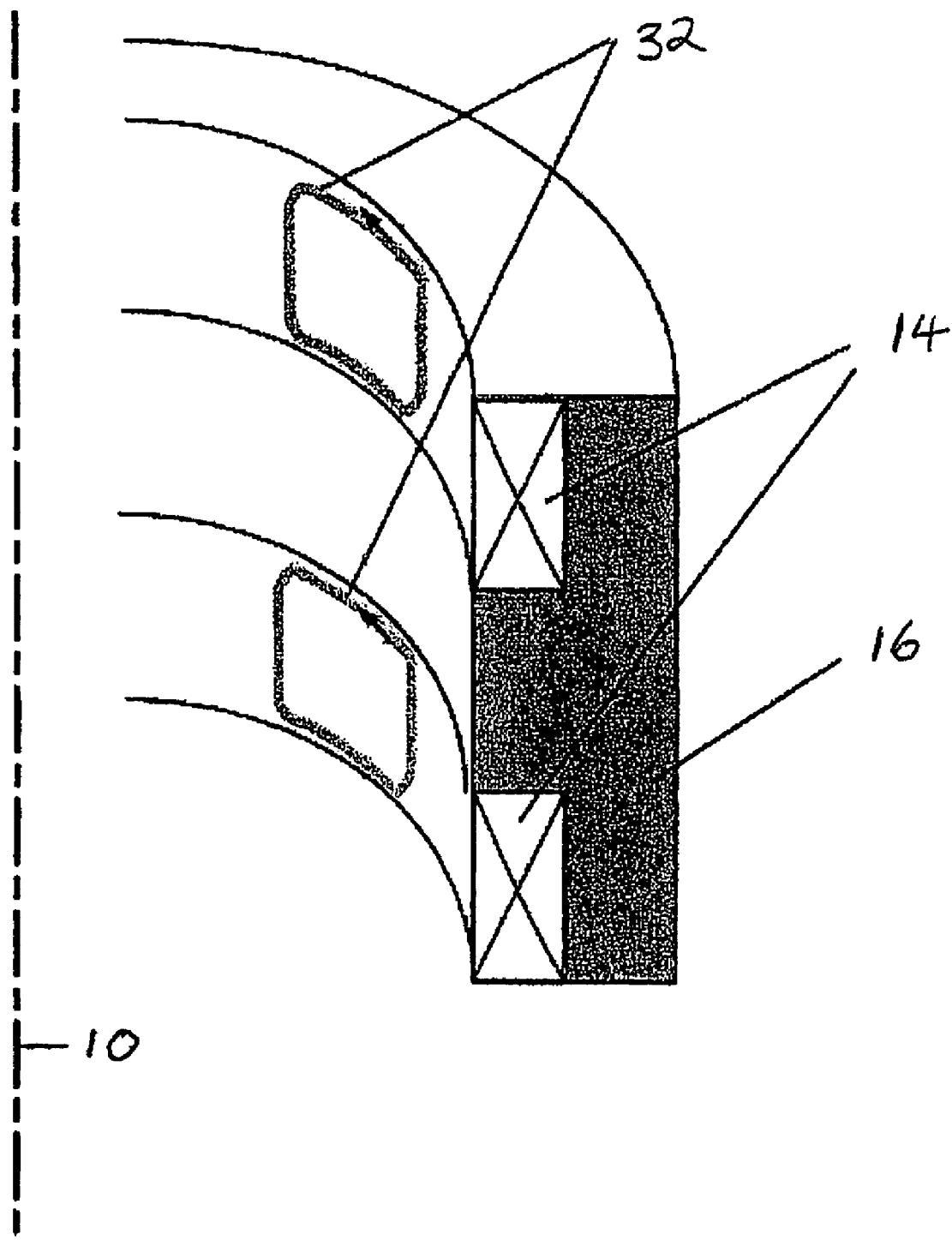
FIG. 5 is a perspective view of yet another embodiment of the quench system according to the invention.

In the embodiment shown in FIG. 5, it is possible to design the shape of the saddle induction coils 32 in order to have zero net flux from the main superconducting winding set 14 through each saddle quench-inducing coil 32. This is automatically satisfied if some current section of the AC quench inducing coils 32 are in the toroidal direction, and the other elements are aligned to the magnetic field direction 10 (two of each of these sections are illustrated in the each AC inducing coil 32 in FIG. 5). In this case, the mutual inductance between the main superconducting winding 14 and the saddle coil 32 is zero, and each saddle quench-inducing coil 32 can be driven separately without large reactive power. However, the arrangement shown in FIG. 5 results in voltages generated in the main superconducting winding 14 which need to be included in the design. In addition, although there is no net force applied to each saddle, there is a net torque applied to the quench-inducing coil 32 which needs to be supported.

The frequency of the AC quench-inducing system disclosed herein can be optimized to maximize the heat per reactive power. One option is to select the frequency of the system that matches the eddy-current penetration time into the conductor. These conductors are complex, possibly having either multiple partially insulated strands, copper or other matrix materials in various forms, superconductor and solders, with eddy current penetration times that are on the order of a millisecond (with frequencies corresponding to about 1 kHz). Optimal coupling to the conductor occurs when the period of the AC fields is comparable to the eddy current penetration time. At lower frequencies, the induced currents decay, while at higher frequencies the currents do not penetrate. On the other hand, if the heating is due mainly to hysteresis, then the heating power increases monotonically with frequency.

A preferred embodiment would use frequencies from about 100 Hz to about 10 kHz. Typically, AC magnetic fields on the order of 50-300 Gauss peak would be sufficient to heat the superconductor to the normal state in about 100 ms.

The invention describes the possibility of creating a large number of discrete quenching sites separated by an unquenched zone. The quench at each induced quenching site propagates by the heating of the quenched zone. In this manner the power required to drive the quench is decreased, with a substantial amount of the energy required to quench the entire main magnet provided by the stored energy in the main magnet. FIG. 5 shows a scheme where multiple AC coils generate quench in a small zone of the main magnet, and the quench propagates to the rest of the magnet.

Two power supplies have been envisioned. The first is a fully charged capacitor bank that resonates with the inductance of the AC quench-inducing coil at the desired frequency. The capacitor driven circuit may have to generate a higher magnetic fields than in the driven case described below in order to store the energy that is required for quenching the magnet. The second is a driven power supply. The power required for a coil with a conductor volume of about 0.1 m$^3$ is on the order of 10 kW for about 100 ms.

Another advantage of the configuration disclosed herein is that other structures in the system, such as the structural support 16 in FIGS. 1, 3 and 5, have shielding currents that minimize the required reactive energy. Because of their relatively large size, they screen the fields over the bulk of the structure, even though their electrical resistivity is much higher than that of the copper in the conductor.

Although the system described has a DC main superconducting magnet, it is possible to use the same concept with a low frequency or pulsed magnet/transformer. Thus, a system operating at 1 Hz would be quenched by AC fields at frequencies at 100-10000 Hz. In the same manner a pulsed coil could be protected by an AC field quenching system that operates at a frequency much higher than the inverse of the pulse duration; equivalently, the period of the AC field should be is shorter than the pulse duration of the pulsed magnet.

The AC coil could be normally conducting or it can be superconducting.

While particular embodiments of the invention have been shown and described, it will be obvious to those skilled in the art that various changes and modifications may be made without departing from the present invention in its broader aspects. It is intended that all matter contained in the above description and shown in the accompanying drawings shall be interpreted as illustrative and not in a limiting sense.

What is claimed is:

1. A quench system for magnet protection comprising:
   a DC superconducting coil; and
   an AC coil system located in proximity to the DC superconducting coil to generate AC magnetic fields to heat the DC superconducting coil to cause a superconducting-to-normal transition over a substantial fraction of the DC superconducting coil.

2. The quench system of claim 1 wherein the DC superconducting coil and the AC coil system are arranged so that the mutual inductance between the DC superconducting coil and the AC coil is close to zero.

3. The quench system of claim 2 wherein magnetic fields of the DC superconducting coil and AC coil system are orthogonal to one another.

4. The quench system of claim 1 wherein the AC coil system includes a plurality of coils.

5. The quench system of claim 4 wherein the AC coil system is wound by interleaving loops or sets of an equal number of loops between the plurality of coils to decrease internal voltages generated in each coil.

6. The quench system of claim 4 wherein each coil in the AC coil system approaches zero mutual inductance with respect to the DC superconducting coil.

7. The quench system of claim 4 wherein the overall AC coil system approaches zero mutual inductance with respect to the DC coil, but each separate coil of the plurality of coils of the AC coil system has a finite mutual inductance with respect to the DC superconducting coil.

8. The quench system of claim 4 where the multiple zones quenched by the plurality of coils is a small fraction of the main magnet, with the quench propagated to the rest of the magnet through heating of the quenched zone by the decaying main stored energy, with a substantial decrease in the energy required to quench the magnet.

9. The quench system of claim 8 further including a high voltage insulation between the AC coil system and the DC superconducting coil.

10. The quench system of claim 1 further including an electrically conducting thermal blanket surrounding the DC superconducting coil, the thermal blanket including at least one gap to prevent induced currents in the thermal blanket from shielding AC magnet fields generated by the AC coil system from the DC superconducting coil.

11. The quench system of claim 1 wherein the frequency of the AC magnetic field is in the range of 100 Hz to 10 kHz.

12. The quench system of claim 1 wherein the magnitude of the AC magnetic field is in the range of 50 to 300 G.

13. The quench system of any of claims 1-12 where the main superconducting magnet is not strictly DC but operates at a frequency much lower than the AC quenching system.

14. The quench system of any of claims 1-12 where the main superconducting magnet is not strictly DC but operates with a pulse width that is much longer than the period of the AC quenching system.

* * * * *